(12) United States Patent
Noguchi

(10) Patent No.: US 12,184,267 B2
(45) Date of Patent: Dec. 31, 2024

(54) SURFACE ACOUSTIC WAVE RESONATOR, ACOUSTIC WAVE FILTER, AND MULTIPLEXER

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 374 days.

(21) Appl. No.: 17/844,986

(22) Filed: Jun. 21, 2022

(65) Prior Publication Data

US 2022/0416762 A1 Dec. 29, 2022

(30) Foreign Application Priority Data

Jun. 23, 2021 (JP) .................................. 2021-104089

(51) Int. Cl.
*H03H 9/25* (2006.01)
*H03H 9/02* (2006.01)
*H03H 9/145* (2006.01)
*H03H 9/64* (2006.01)
*H03H 9/72* (2006.01)

(52) U.S. Cl.
CPC .......... *H03H 9/25* (2013.01); *H03H 9/02637* (2013.01); *H03H 9/14541* (2013.01); *H03H 9/14582* (2013.01); *H03H 9/6483* (2013.01); *H03H 9/725* (2013.01)

(58) Field of Classification Search
CPC ...... H03H 9/25; H03H 9/02637; H03H 9/145; H03H 9/725; H03H 9/14541; H03H 9/14582; H03H 9/6483; H03H 9/02732; H03H 9/02543
See application file for complete search history.

(56) References Cited

U.S. PATENT DOCUMENTS 10,491,192 B1 * 11/2019 Plesski ..................... H03H 3/02
2004/0080383 A1 * 4/2004 Takamine .......... H03H 9/14591
333/194

(Continued)

FOREIGN PATENT DOCUMENTS

JP 2013-085273 A 5/2013
JP 2018-182460 A 11/2018

(Continued)

*Primary Examiner* — Cindy Trandai
(74) *Attorney, Agent, or Firm* — Keating & Bennett, LLP

(57) ABSTRACT

A surface acoustic wave resonator includes one IDT electrode and reflectors. When a distance between an electrode finger Fe(k) and an electrode finger Fe(k+1) is defined as a k-th electrode finger pitch, in an electrode finger Fe(k-1), the electrode finger Fe(k), and the electrode finger Fe(k+1), a value obtained by dividing a difference between the electrode finger pitch and a section average electrode finger pitch, which is an average of the electrode finger pitch and the electrode finger pitch, by an overall average electrode finger pitch is defined as a pitch deviation ratio, and a distribution obtained by calculating the pitch deviation ratio for all electrode fingers of the IDT electrode or the reflectors is defined as a histogram of the pitch deviation ratio, the IDT electrode or the reflectors have a standard deviation of the pitch deviation ratio in the histogram larger than or equal to about 0.2%.

20 Claims, 8 Drawing Sheets

(56) References Cited

U.S. PATENT DOCUMENTS

| | | | |
|---|---|---|---|
| 2004/0233018 A1* | 11/2004 | Watanabe | H03H 9/0085 |
| | | | 333/195 |
| 2007/0024397 A1* | 2/2007 | Otsuka | H03H 9/6469 |
| | | | 333/195 |
| 2007/0052499 A1* | 3/2007 | Tani | H03H 9/14517 |
| | | | 333/195 |
| 2011/0199163 A1* | 8/2011 | Yamanaka | H03H 9/14582 |
| | | | 331/158 |
| 2012/0146746 A1* | 6/2012 | Shimozono | H03H 9/0061 |
| | | | 333/195 |
| 2018/0109238 A1* | 4/2018 | Yamaji | H03H 9/6493 |
| 2018/0294402 A1 | 10/2018 | Shimomura et al. | |
| 2019/0036554 A1 | 1/2019 | Ito et al. | |
| 2019/0158060 A1* | 5/2019 | Maeda | H03H 9/02992 |
| 2019/0245514 A1* | 8/2019 | Takata | H03H 9/02858 |
| 2019/0326884 A1* | 10/2019 | Nosaka | H03H 9/145 |
| 2020/0287519 A1* | 9/2020 | Kishino | H03H 9/0028 |
| 2020/0287523 A1* | 9/2020 | Urata | H03H 9/6483 |
| 2021/0175871 A1* | 6/2021 | Komiyama | H03H 9/02834 |
| 2022/0140809 A1* | 5/2022 | Noguchi | H03H 9/6483 |
| | | | 333/133 |

FOREIGN PATENT DOCUMENTS

| | | |
|---|---|---|
| WO | 2017/131170 A1 | 8/2017 |
| WO | 2021/010379 A1 | 1/2021 |

* cited by examiner

SURFACE ACOUSTIC WAVE RESONATOR, ACOUSTIC WAVE FILTER, AND MULTIPLEXER

CROSS REFERENCE TO RELATED APPLICATIONS

This application claims the benefit of priority to Japanese Patent Application No. 2021-104089 filed on Jun. 23, 2021. The entire contents of this application are hereby incorporated herein by reference.

BACKGROUND OF THE INVENTION

1. Field of the Invention

The present invention relates to surface acoustic wave resonators, acoustic wave filters, and multiplexers.

2. Description of the Related Art

A surface acoustic wave resonator having one interdigital transducer (IDT) electrode and a reflector arranged so as to be adjacent to the IDT electrode is conventionally known. The IDT electrode and the reflector each have a plurality of electrode fingers. The plurality of electrode fingers each extend in a direction crossing a propagation direction of an acoustic wave and are arranged in parallel to one another.

Japanese Unexamined Patent Application Publication No. 2018-182460 discloses a surface acoustic wave resonator having an IDT electrode with an electrode finger pitch, which is a center-to-center distance between two electrode fingers adjacent to each other in the propagation direction of the acoustic wave, consecutively varied in the propagation direction of the acoustic wave. Also, Japanese Unexamined Patent Application Publication No. 2013-85273 discloses a surface acoustic wave resonator having an IDT electrode with the electrode finger pitch consecutively varied in the propagation direction of the acoustic wave. International Publication No. 2017/131170 discloses a surface acoustic wave resonator configured of an IDT electrode having a plurality of areas in which the electrode finger pitch in the propagation direction of the acoustic wave is constant.

In the surface acoustic wave resonators disclosed in Japanese Unexamined Patent Application Publication No. 2018-182460, Japanese Unexamined Patent Application Publication No. 2013-85273 and International Publication No. 2017/131170, the reflection coefficient with respect to a frequency larger than or equal to a predetermined value, which is a frequency higher than the anti-resonant frequency of the surface acoustic wave resonator, is decreased, and ripples may occur on a high-frequency side with respect to the anti-resonant frequency.

International Publication No. 2021/010379 discloses an acoustic wave filter including a longitudinally-coupled resonator including a plurality of IDT electrodes. According to the technology disclosed in International Publication No. 2021/010379, the attenuation characteristics of the acoustic wave filter can be improved. However, in International Publication No. 2021/010379, when the IDT electrode included in the resonator includes one IDT electrode, how the above-described ripples are suppressed is not disclosed.

SUMMARY OF THE INVENTION

Preferred embodiments of the present invention provide surface acoustic wave resonators that each reduce or prevent ripples occurring on a high-frequency side with respect to an anti-resonant frequency when an IDT electrode included in the surface acoustic wave resonator includes one IDT electrode.

A surface acoustic wave resonator according to a preferred embodiment of the present invention includes a substrate having piezoelectricity, an IDT electrode on the substrate, and reflectors sandwiching the IDT electrode therebetween. The IDT electrode included in the surface acoustic wave resonator is defined by one IDT electrode. The IDT electrode and the reflectors each include a plurality of electrode fingers extending in a direction crossing the propagation direction of the acoustic wave and are in parallel or substantially in parallel to one another. When a distance between a k-th electrode finger, where k is an integer larger than or equal to 2, and a (k+1)-th electrode finger in the propagation direction of the acoustic wave is defined as a k-th electrode finger pitch, in a (k−1)-th electrode finger, the k-th electrode finger, and the (k+1)-th electrode finger adjacent to each other, a value obtained by dividing a difference between the k-th electrode finger pitch and a section average electrode finger pitch, which is an average of the (k−1)-th electrode finger pitch and the (k+1)-th electrode finger pitch, by an overall average electrode finger pitch, which is an average pitch of overall electrode fingers which the IDT electrode or the reflectors have, the IDT electrode or the reflectors including the adjacent three electrode fingers, is defined as a pitch deviation ratio of the k-th electrode finger, and a distribution of the pitch deviation ratio obtained by calculating the pitch deviation ratio of the k-th electrode finger for all of electrode fingers in the IDT electrode or the reflectors, the IDT electrode or the reflectors including the adjacent three electrode fingers, is defined as a histogram of the pitch deviation ratio, at least one of the IDT electrode and the reflectors has a standard deviation of the pitch deviation ratio in the histogram larger than or equal to about 0.2%.

A surface acoustic wave resonator according to ad preferred embodiment of the present invention includes a substrate having piezoelectricity, and an IDT electrode on the substrate. The IDT electrode included in the surface acoustic wave resonator includes one IDT electrode. The IDT electrode includes a plurality of electrode fingers extending in a direction crossing a propagation direction of an acoustic wave and arranged in parallel to one another. When a distance between a k-th electrode finger, k is an integer larger than or equal to 2, and a (k+1)-th electrode finger in the propagation direction of the acoustic wave is defined as a k-th electrode finger pitch, in a (k−1)-th electrode finger, the k-th electrode finger, and the (k+1)-th electrode finger adjacent to each other, a value obtained by dividing a difference between the k-th electrode finger pitch and a section average electrode finger pitch, which is an average of the (k−1)-th electrode finger pitch and the (k+1)-th electrode finger pitch, by an overall average electrode finger pitch, which is an average pitch of overall electrode fingers which the IDT electrode including the adjacent three electrode fingers has, is defined as a pitch deviation ratio of the k-th electrode finger, and a distribution of the pitch deviation ratio obtained by calculating the pitch deviation ratio of the k-th electrode finger for all electrode fingers which the IDT electrode including the adjacent three electrode fingers has is defined as a histogram of the pitch deviation ratio, the IDT electrode has a standard deviation of the pitch deviation ratio in the histogram larger than or equal to about 0.2%.

An acoustic wave filter according to a preferred embodiment of the present invention includes a surface acoustic wave resonator according to a preferred embodiment of the present invention.

A multiplexer according to a preferred embodiment of the present invention includes a transmission filter and a reception filter. The transmission filter includes an acoustic wave filter according to a preferred embodiment of the present invention.

According to preferred embodiments of the present invention, ripples occurring in the surface acoustic wave resonators on a high-frequency side with respect to the anti-resonant frequency are able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Prior to describing specific structures of preferred embodiments of the present invention, problems in Comparative Examples 1 and 2 and the general outlines of preferred embodiments of the present invention are described with reference to FIG. 1 to FIG. 3.

Figure 1:
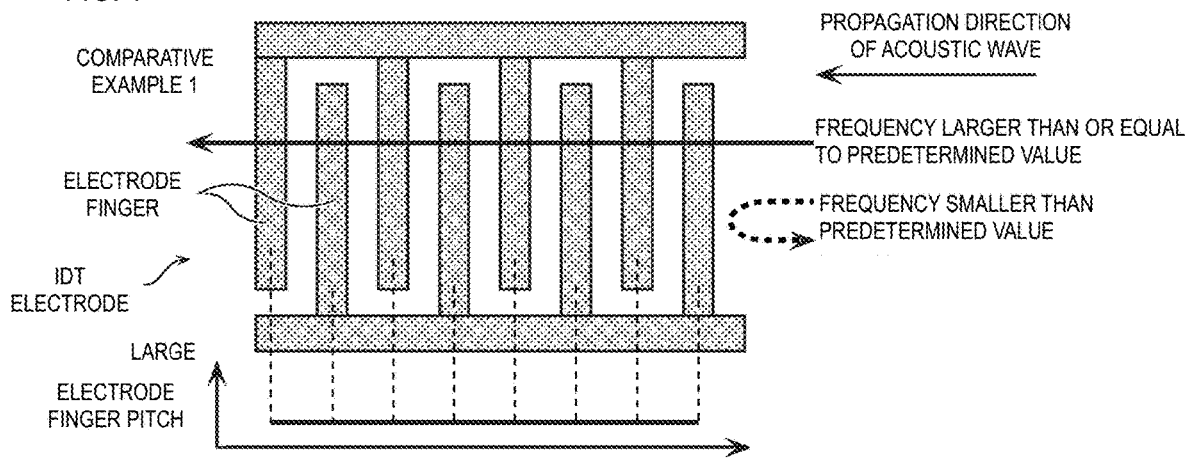
FIG. 1 is a diagram schematically showing an IDT electrode of a surface acoustic wave resonator of Comparative Example 1.

FIG. 1 is a diagram schematically showing an IDT electrode of a surface acoustic wave resonator of Comparative Example 1. FIG. 2 is a diagram schematically showing an IDT electrode of a surface acoustic wave resonator of Comparative Example 2. FIG. 3 is a diagram schematically showing an IDT electrode of a surface acoustic wave resonator according to a preferred embodiment of the present invention.

Figure 2:
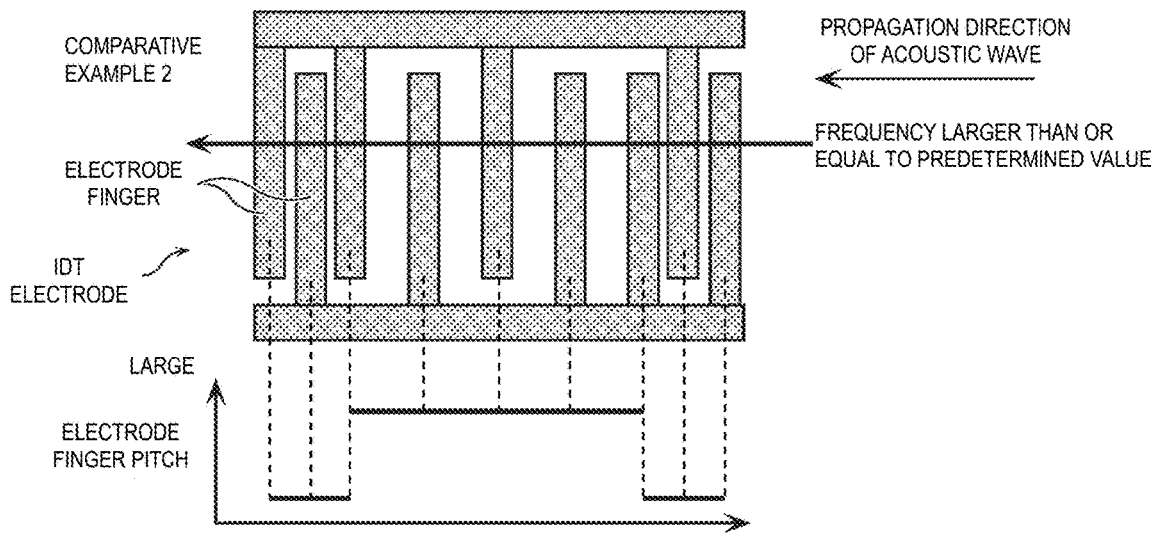
FIG. 2 is a diagram schematically showing an IDT electrode of a surface acoustic wave resonator of Comparative Example 2.
Figure 3:
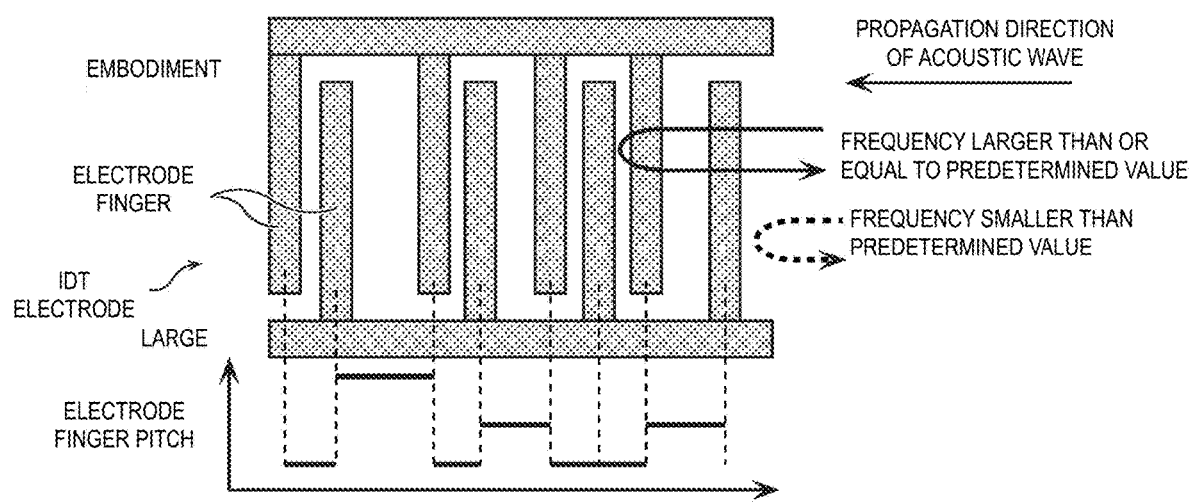
FIG. 3 is a diagram schematically showing an IDT electrode of a surface acoustic wave resonator according to a preferred embodiment of the present invention.

The IDT electrodes shown in FIG. 1 to FIG. 3 include a plurality of electrode fingers. The plurality of electrode fingers each extend in a direction crossing a propagation direction of an acoustic wave, and are arranged in parallel or substantially in parallel to one another. In this case, the propagation direction of the acoustic wave and the direction in which the electrode fingers extend are orthogonal or substantially orthogonal to each other.

As shown in FIG. 1, in the IDT electrode of Comparative Example 1, an electrode finger pitch, which is a center-to-center distance between two electrode fingers adjacent to each other in the propagation direction of the acoustic wave, is equal or substantially equal. In the surface acoustic wave resonator including the IDT electrode, while the reflection coefficient increases with respect to a frequency smaller than a predetermined value, the reflection coefficient abruptly decreases with respect to a frequency larger than or equal to the predetermined value, which is a frequency higher than the anti-resonant frequency of the surface acoustic wave resonator. With this, large ripples may occur on a high-frequency side with respect to the anti-resonant frequency of the surface acoustic wave resonator. Note that ripples herein refer to ripples in reflection characteristics of the surface acoustic wave resonator (refer to part (a) of FIG. 9 and so forth).

As shown in FIG. 2, in the IDT electrode of Comparative Example 2, the electrode finger pitch is constant or substantially constant in a certain section. In the surface acoustic wave resonator including the IDT electrode, the reflection coefficient with respect to a frequency larger than or equal to the predetermined value abruptly decreases in the section where the electrode finger pitch is constant or substantially constant. With this, large ripples may occur on a high-frequency side with respect to the anti-resonant frequency of the surface acoustic wave resonator.

As shown in FIG. 3, in the IDT electrode of the present preferred embodiment, the respective electrode fingers are arrayed so that the electrode finger pitch is irregularly varied. With this structure in which the electrode finger pitch is irregularly varied, an abrupt decrease in the reflection coefficient can be reduced or prevented with respect to a frequency larger than or equal to a predetermined value. With this, an occurrence of large ripples can be reduced or prevented on a high-frequency side with respect to the anti-resonant frequency.

In the following, preferred embodiments of the present invention are described in detail with reference to the drawings. Note that any of the preferred embodiments described below represents a generic or specific example. Numerical values, shapes, materials, components, arrangement and connection mode of the components, and the like which are described in the preferred embodiments described below are merely examples, and are not intended to restrict the present invention. Of the components of the preferred embodiments described below, those not described in independent claims are described as arbitrary or optional components. Also, the size of the components shown in the drawings or a ratio in size thereof is presented not necessarily in a strict sense.

Preferred Embodiment

Structure of Surface Acoustic Wave Resonator and Acoustic Wave Filter

The structure of a surface acoustic wave resonator and an acoustic wave filter according to a preferred embodiment of the present invention is described with reference to FIG. 4 and FIG. 5.

Figure 4:
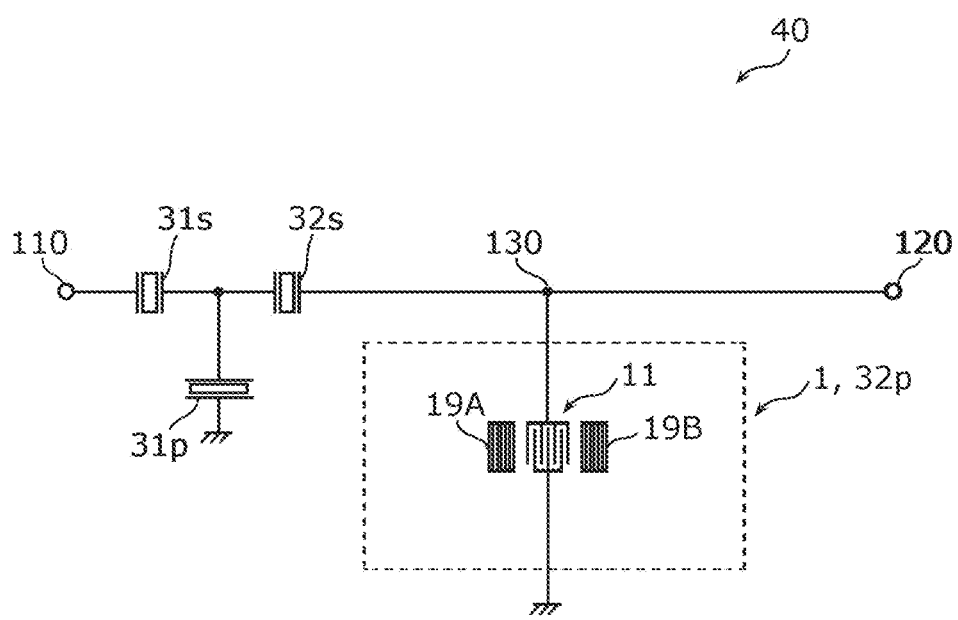
FIG. 4 is a circuitry diagram of an acoustic wave filter according to a preferred embodiment of the present invention.

FIG. 4 is a circuitry diagram of an acoustic wave filter 40 including a surface acoustic wave resonator 1 according to the present preferred embodiment.

As shown in FIG. 4, the acoustic wave filter 40 includes series-arm resonators 31s and 32s, parallel-arm resonators 31p and 32p, and input/output terminals 110 and 120.

The series-arm resonators 31s and 32s are acoustic wave resonators arrayed in series on a path connecting the input/output terminal 110 and the input/output terminal 120. The parallel-arm resonators 31p and 32p are acoustic wave resonators each connected between a node and the ground on the path. Note that the node is a location where a path is branched to another path.

The surface acoustic wave resonator 1 of the present preferred embodiment is applied to, for example, the parallel-arm resonator 32p. The surface acoustic wave resonator 1 is arranged between the ground and a node 130 between the series-arm resonator 32s and the input/output terminal 120. The surface acoustic wave resonator 1 includes an interdigital transducer (IDT) electrode 11 and reflectors 19A and 19B on both outer side portions of the IDT electrode 11. The IDT electrode 11 included in the surface acoustic wave resonator 1 includes one IDT electrode.

Figure 5:
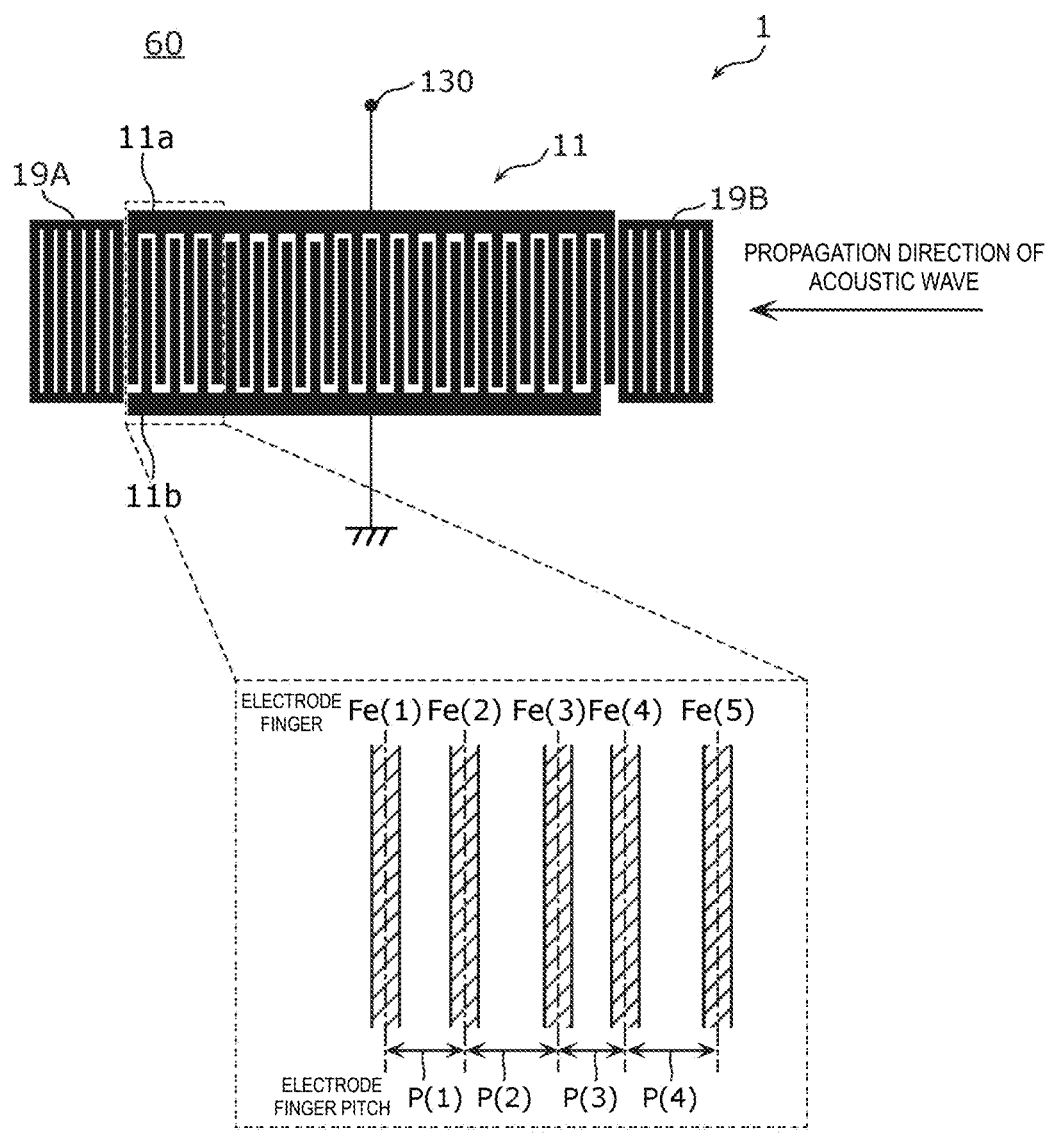
FIG. 5 is a schematic plan view showing the electrode structure of a surface acoustic wave resonator according to a preferred embodiment of the present invention.

FIG. 5 is a schematic plan view showing the electrode structure of the surface acoustic wave resonator 1. Note that the surface acoustic wave resonator 1 shown in FIG. 5 is to describe a typical plan layout structure of the IDT electrode 11 and the reflectors 19A and 19B and this does not restrict the number and length of electrode fingers included in the IDT electrode, the electrode finger pitch, and so forth.

As shown in FIG. 5, the IDT electrode 11 and the reflectors 19A and 19B are provided on a substrate 60 having piezoelectricity. The IDT electrode 11 includes comb-shaped electrodes 11a and 11b. The comb-shaped electrode 11a is connected to the node 130, and the comb-shaped electrode 11b is connected to the ground.

The comb-shaped electrode 11a is one example of a first comb-shaped electrode, and includes a portion of electrode fingers among a plurality of electrode fingers of the IDT electrode 11 and a busbar electrode connecting one ends of the a portion of the electrode fingers together. The comb-shaped electrode 11b is one example of a second comb-shaped electrode, and includes the other portion of the electrode fingers among the plurality of electrode fingers of the IDT electrode 11 and a busbar electrode connecting the other ends of the other portion of the electrode fingers together. The electrode fingers of the comb-shaped electrode 11a and the electrode fingers of the comb-shaped electrode 11b are interdigitated with one another.

The reflectors 19A and 19B sandwich the IDT electrode 11 therebetween in the propagation direction of the acoustic wave. Specifically, the reflectors 19A and 19B are provided on both sides of the IDT electrode 11 so as to sandwich the IDT electrode 11 therebetween. The reflectors 19A and 19B each include a plurality of electrode fingers. The reflectors are not necessarily required to be provided on both outer side portions of the IDT electrode 11 and one reflector may be provided on one side portion. When an acoustic wave propagating on the substrate 60 is reflected at an end portion or the like of the substrate 60, no reflector may be provided on the substrate 60.

While an example has been described in the above-described preferred embodiment in which the surface acoustic wave resonator 1 is included as the parallel-arm resonator 32p, this is not meant to be restrictive. The surface acoustic wave resonator 1 may be provided as the series-arm resonator 31s or 32s or the parallel-arm resonator 31p.

In the acoustic wave filter 40, any number of series-arm resonators and parallel-arm resonators can be provided, and the series-arm resonators 31s and 32s and the parallel-arm resonator 31p can be omitted. Also, in the acoustic wave filter 40 according to the present preferred embodiment, another circuit element, wire, or the like, for example, may be inserted in a path connecting any acoustic wave resonator, any input/output terminal, and the ground disclosed in FIG. 4.

Electrode Finger Pitch

The electrode finger pitches of the IDT electrode 11 and the reflectors 19A and 19B are described with reference to FIG. 5 and FIG. 6.

As shown in FIG. 5, the IDT electrode 11 and the reflectors 19A and 19B each include a plurality of electrode fingers Fe extending in a direction crossing the propagation direction of the acoustic wave and arranged in parallel or substantially in parallel to one another.

The surface acoustic wave resonator 1 according to the present preferred embodiment includes a feature in a distribution of electrode finger pitches P, which each indicate a distance between the electrode fingers Fe adjacent to each other (a distance between center lines of the electrode fingers Fe in the propagation direction of the acoustic wave). Here, as shown in FIG. 5, in the IDT electrode or the reflectors, a distance between a first electrode finger Fe(1) and a second electrode finger Fe(2) in the propagation direction of the acoustic wave (a distance between a center line of the electrode finger Fe(1) in the propagation direction of the acoustic wave and a center line of the electrode finger Fe(2) in the propagation direction of the acoustic wave) is defined as an electrode finger pitch P(1) of the electrode finger Fe(1). Hereinafter, similarly, an electrode finger pitch P(2) of the electrode finger Fe(2), an electrode finger pitch P(3) of the electrode finger Fe(3), and an electrode finger pitch P(4) of the electrode finger Fe(4) are defined. That is, a distance between an electrode finger Fe(k) and an electrode finger Fe(k+1) (a distance between a center line of the electrode finger Fe(k) in the propagation direction of the acoustic wave and a center line of the electrode finger Fe(k+1) in the propagation direction of the acoustic wave) is defined as an electrode finger pitch P(k) of the k-th electrode finger Fe(k) (k is a natural number) in the propagation direction of the acoustic wave.

Figure 6:
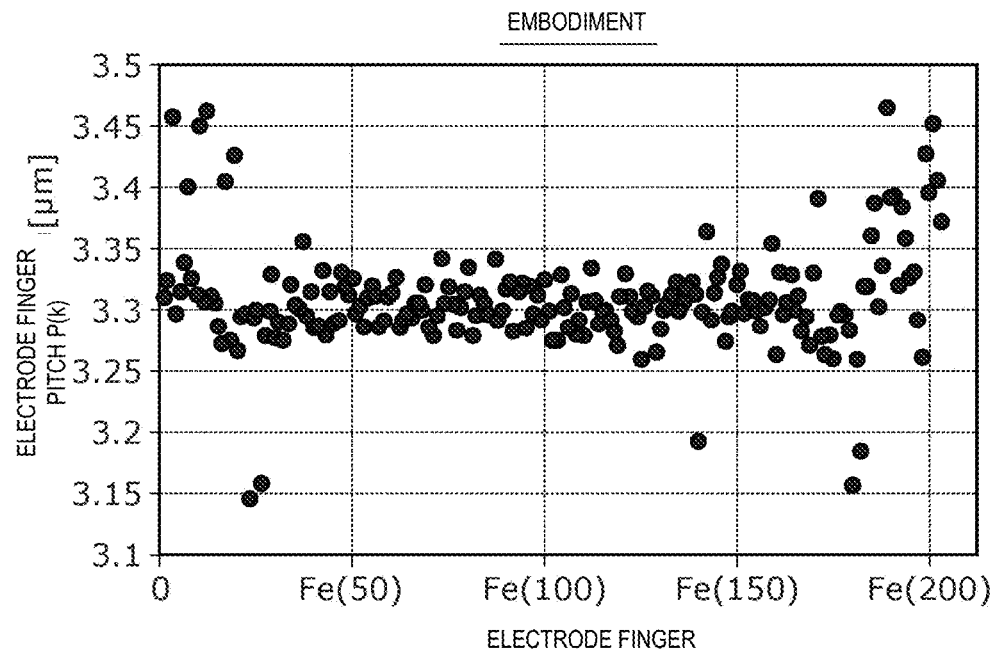
FIG. 6 is a graph showing a distribution of electrode finger pitches of a surface acoustic wave resonator according to a preferred embodiment of the present invention.

FIG. 6 is a graph showing a distribution of electrode finger pitches P(k) of the surface acoustic wave resonator. The horizontal axis in FIG. 6 represents the positions of the electrode finger Fe(1) to an electrode finger Fe(k) of the surface acoustic wave resonator 1, and the vertical axis represents the electrode finger pitch P(k) of the electrode finger Fe(k).

As shown in FIG. 6, the surface acoustic wave resonator 1 includes an electrode finger section where the electrode fingers Fe are arrayed so that the electrode finger pitch P(k) is irregular. "Irregular" means not to include a constant state, a proportionally-varying state, and a periodically-varying state, but to include a randomly-varying state. Since the surface acoustic wave resonator 1 includes the electrode finger section in which the electrode finger pitch P(k) is irregular, ripple occurrence bands determined by the respective electrode finger pitches P(k) can be appropriately distributed.

The surface acoustic wave resonator 1 of the present preferred embodiment includes the IDT electrode 11 and the reflectors 19A and 19B not having a constant electrode finger pitch P(k) in four or more electrode fingers Fe adjacent to one another and not having a constant gradient (a constant rate of change) of the electrode finger pitch P(k) in four or more electrode fingers Fe adjacent to one another.

For example, the surface acoustic wave resonator 1 has a relationship in which, when electrode finger pitches of four electrode fingers adjacent to one another in the propagation direction of the acoustic wave are denoted as P(k−1), P(k), and P(k+1) in order of alignment in the propagation direction of the acoustic wave, P(k−1)<P(k+1)<P(k) or P(k−1)>P(k+1)>P(k) is at least partially satisfied.

Note that in the surface acoustic wave resonator 1 shown in FIG. 6, while the electrode fingers Fe are arrayed so that the electrode finger pitch P(k) is irregular in all of the IDT electrode and the reflectors 19A and 19B, the surface acoustic wave resonator 1 is not limited to this. That is, the surface acoustic wave resonator 1 is only required to include an electrode finger section in which the electrode finger pitch P(k) is irregular in four or more electrode fingers Fe adjacent to one another in at least a portion of the IDT electrode 11 and the reflectors 19A and 19B.

For example, in the surface acoustic wave resonator 1, a portion of the electrode fingers of the plurality of electrode fingers Fe may have a constant or substantially constant electrode finger pitch and electrode fingers that remain except the portion may have a relationship of P(k−1)<P(k+1)<P(k) or P(k−1)>P(k+1)>P(k).

For example, the plurality of electrode fingers Fe included in the IDT electrode 11 may have a constant or substantially constant electrode finger pitch and the plurality of electrode fingers Fe included in the reflectors 19A and 19B may have a relationship of P(k−1)<P(k+1)<P(k) or P(k−1)>P(k+1)>P(k).

For example, the plurality of electrode fingers Fe included in the reflectors 19A and 19B may have a constant or substantially constant electrode finger pitch and the plurality of electrode fingers Fe included in the IDT electrode 11 may have a relationship of P(k−1)<P(k+1)<P(k) or P(k−1)>P(k+1)>P(k).

For example, in the surface acoustic wave resonator 1, all of the electrode finger pitches P(k) between two electrode fingers adjacent to each other in the propagation direction of the acoustic wave may be varied with one another.

Pitch Deviation Ratio and its Standard Deviation

A pitch deviation ratio D of the electrode finger Fe(k) in the IDT electrode 11 and the reflectors 19A and 19B and its standard deviation SD are described with reference to FIG. 7 and FIG. 8.

Figure 7:
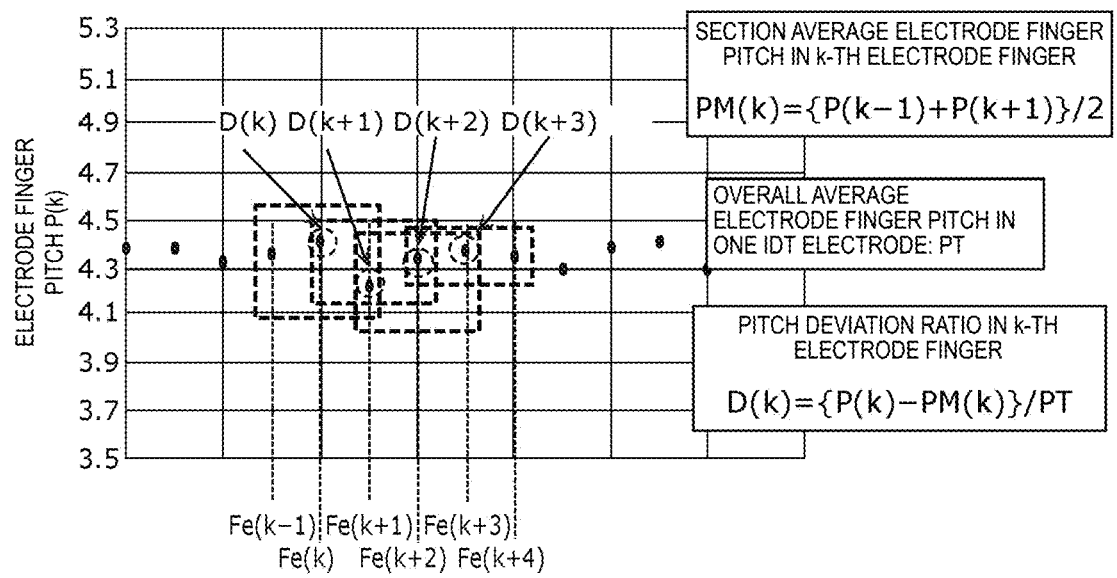
FIG. 7 is a diagram for describing the definition of a section average electrode finger pitch, an overall average electrode finger pitch, and a pitch deviation ratio of a surface acoustic wave resonator according to a preferred embodiment of the present invention.

FIG. 7 is a diagram for describing the definition of a section average electrode finger pitch PM(k), an overall average electrode finger pitch PT, and a pitch deviation ratio D(k) of the surface acoustic wave resonator 1.

FIG. 7 shows one example of a distribution of the electrode finger pitch P(k) of the IDT electrode or the reflectors of a surface acoustic wave resonator. The horizontal axis in FIG. 7 represents the position of the electrode finger Fe(k) of the IDT electrode and the reflectors, and the vertical axis represents the electrode finger pitch P(k) of the electrode finger Fe(k).

As described above, first, (1) a distance between a k (k is an integer larger than or equal to 2)-th electrode finger Fe(k) and a (k+1)-th electrode finger Fe(k+1) in the propagation direction of the acoustic wave (a distance between a center line of the electrode finger Fe(k) in the propagation direction of the acoustic wave and a center line of the electrode finger Fe(k+1) in the propagation direction of the acoustic wave) is defined as a k-th electrode finger pitch P(k).

Next, (2) in three electrode fingers adjacent to one another, that is, an electrode finger Fe(k−1), the electrode finger Fe(k), and the electrode finger Fe(k+1), an average of the electrode finger pitch P(k−1) and the electrode finger pitch P(k+1) is denoted as a section average electrode finger pitch PM(k)[={P(k−1)+P(k+1)}/2]. Here, a value obtained by dividing a difference between the electrode finger pitch P(k) and the section average electrode finger pitch PM(k) [=P(k)−PM(k)] by an overall average electrode finger pitch PT, which is an average pitch of the overall electrode fingers which the IDT electrode or the reflectors have, the IDT electrode or the reflectors including the electrode fingers Fe(k−1), Fe(k), and Fe(k+1), is defined as a pitch deviation ratio D(k) [={P(k)−PM(k)}/PT] of the electrode finger Fe(k).

Next, (3) the pitch deviation ratio D(k) of the electrode finger Fe(k) is calculated for all of the electrode fingers Fe which the IDT electrode or the reflectors include, the IDT electrode or the reflectors including the electrode fingers Fe(k−1), Fe(k), and Fe(k+1), and a histogram of the pitch deviation ratio D(k) in the IDT electrode or the reflectors is calculated.

Figure 8:
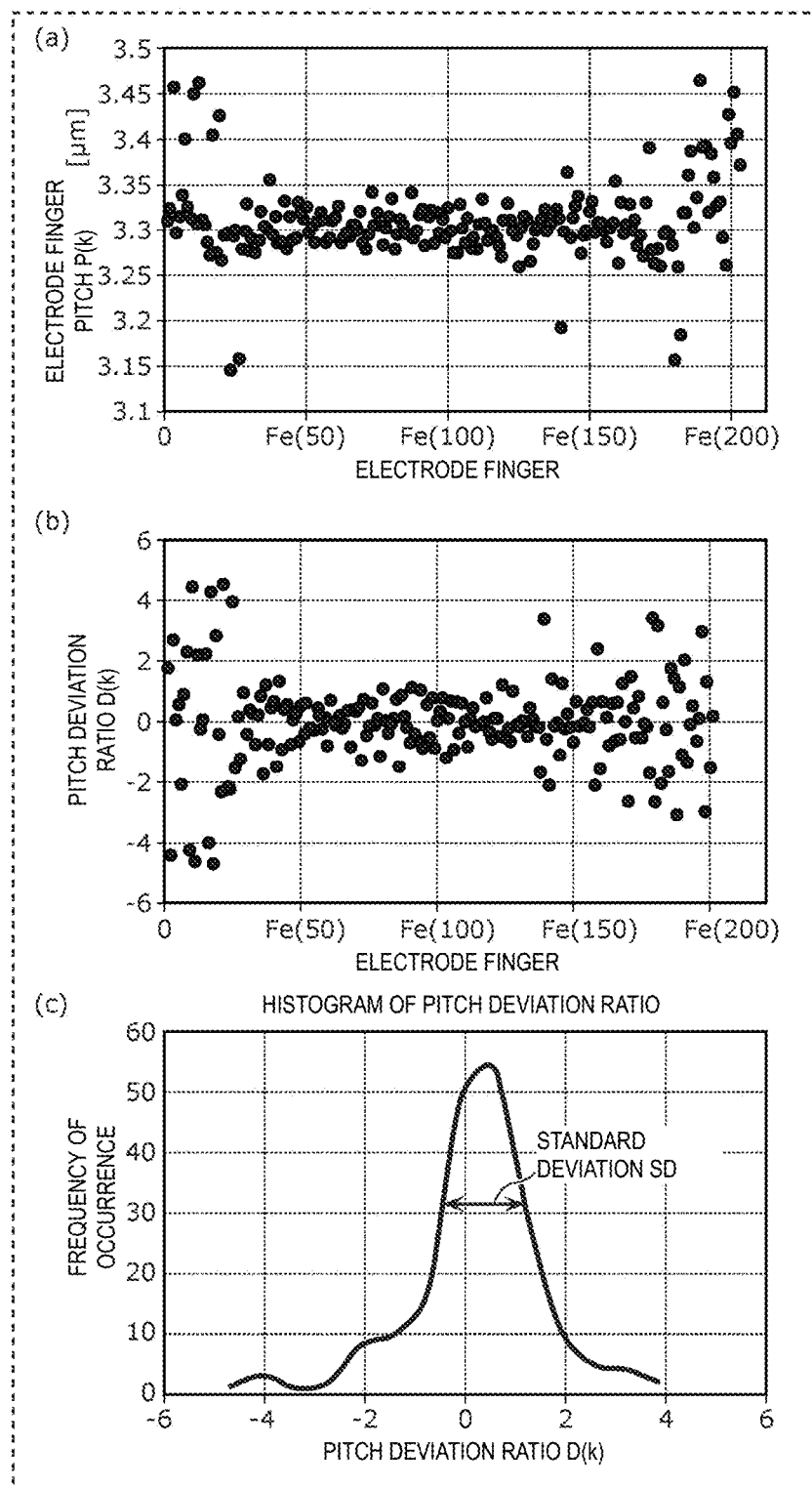
FIG. 8 includes diagrams for describing a pitch deviation ratio and its standard deviation in an irregular electrode finger pitch distribution of a surface acoustic wave resonator according to a preferred embodiment of the present invention.

FIG. 8 includes diagrams for describing a pitch deviation ratio D(k) and its standard deviation SD in an irregular electrode finger pitch distribution of the surface acoustic wave resonator 1.

Similar to FIG. 6, part (a) of FIG. 8 shows a graph representing a distribution of the electrode finger pitch P(k) of the IDT electrode 11 and the reflectors 19A and 19B of the surface acoustic wave resonator 1. In parts (a) to (c) of FIG. 8, an example is shown in which the electrode finger at the left end of the reflector 19A shown in FIG. 5 is taken as an electrode finger Fe(1). In the surface acoustic wave resonator 1 of the present preferred embodiment, the electrode finger pitch P(k) is distributed in a range between, for example, about 3.14 μm and about 3.47 μm inclusive. In other words, the distribution is made so that the minimum value of the electrode finger pitch P(k) is about 3.20 μm or larger and the maximum value is about 3.40 μm or smaller, for example.

Part (b) of FIG. 8 shows one example of a distribution of the pitch deviation ratio D(k) of the electrode fingers Fe of the IDT electrode 11 and the reflectors 19A and 19B. The horizontal axis represents the positions of the electrode fingers Fe(k) of the IDT electrode 11 or the reflectors 19A and 19B, and the vertical axis represents the pitch deviation ratio D(k). In the surface acoustic wave resonator 1 of the present preferred embodiment, the pitch deviation ratio D(k) is distributed in a range between, for example, about −5% and about 5% inclusive. In other words, the distribution is made so that the minimum value of the pitch deviation ratio D(k) is smaller than about −4% and the maximum value is larger than 4%.

Part (c) of FIG. 8 shows one example of a histogram of the pitch deviation ratio D(k) of the electrode fingers Fe of the IDT electrode 11 and the reflectors 19A and 19B. Based on this histogram of the pitch deviation ratio D(k), the standard deviation SD of the pitch deviation ratio of the electrode fingers Fe is calculated. According to the above-described definition, as the regularity of the electrode finger pitch P(k) is stronger, the standard deviation SD of the pitch deviation ratio is smaller, and as the irregularity of the electrode finger pitch P(k) is stronger, the standard deviation SD of the pitch deviation ratio is larger.

In the present preferred embodiment, in at least one of the IDT electrode 11 and the reflectors 19A and 19B, the standard deviation SD of the pitch deviation ratio in the above-described histogram is, for example, about 0.2% or larger. With this structure, an abrupt decrease in the reflection coefficient can be reduced or prevented with respect to a frequency higher than the anti-resonant frequency. With this, an occurrence of an unwanted standing wave in the surface acoustic wave resonator 1 can be reduced or prevented, and an occurrence of large ripples on a high-frequency side with respect to the anti-resonant frequency can be reduced or prevented. The advantageous effects of the surface acoustic wave resonator 1 having the above-described structure are described below.

Advantageous Effects

Figure 9:
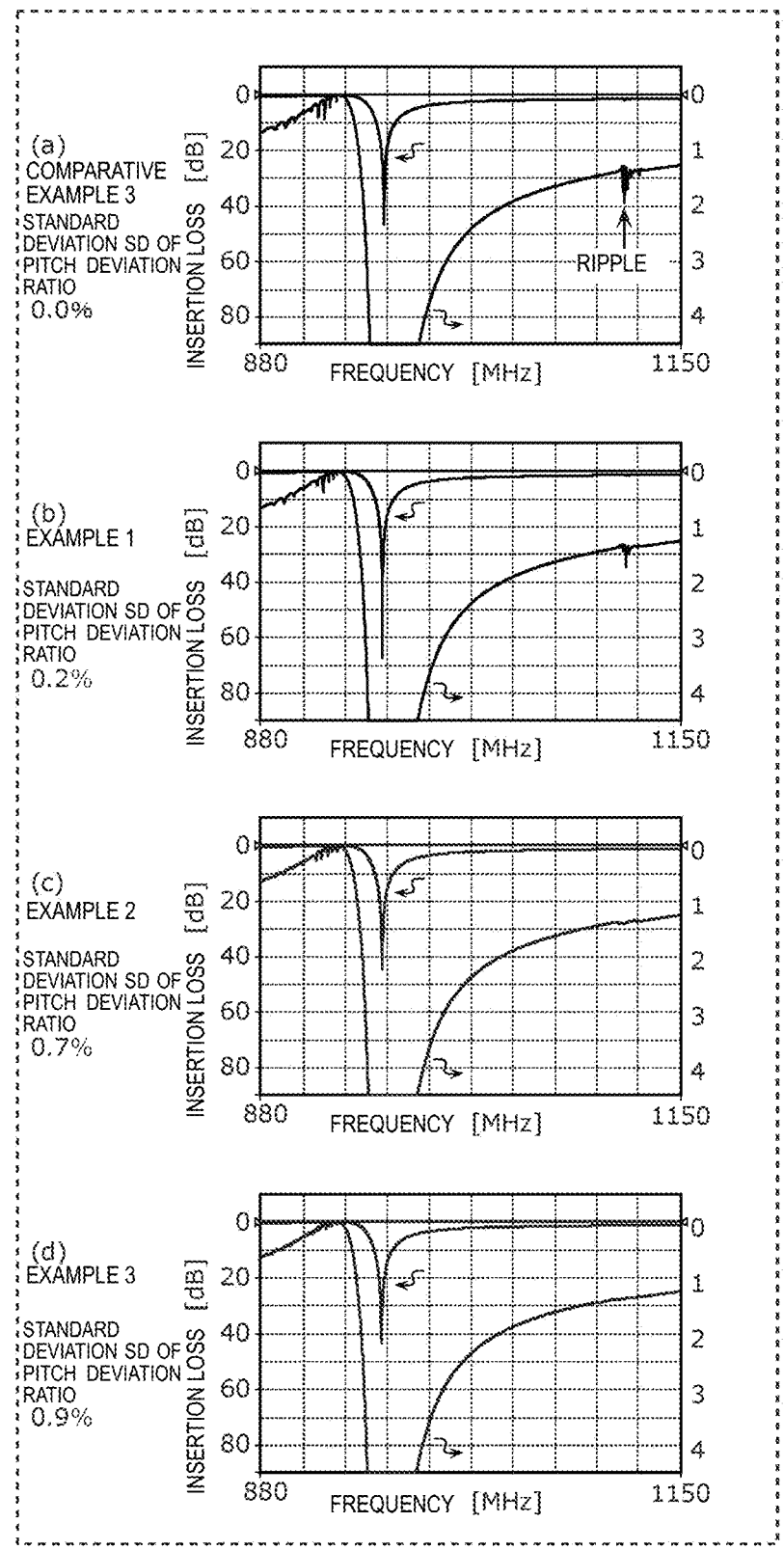
FIG. 9 includes diagrams showing insertion loss of the surface acoustic wave resonators of Comparative Example 3 and Examples 1, 2, and 3 of preferred embodiments of the present invention.

Parts (a) to (d) of FIG. 9 include diagrams showing insertion loss of the surface acoustic wave resonators of Comparative Example 3 and Examples 1, 2, and 3. In FIG. 9, it is shown that return loss increases toward a lower side of the vertical axis.

Comparative Example 3 is shown in part (a) of FIG. 9. In part (a) of FIG. 9, an example is shown in which the electrode finger pitches P(k) of the plurality of electrode fingers Fe are all equal or substantially equal and the standard deviation SD of the pitch deviation ratio is 0.0%. In Comparative Example 3, large ripples occur on a high-frequency side with respect to the anti-resonant frequency (for example, about 959 MHz) of the surface acoustic wave resonator, specifically, near a frequency of about 1110 MHz.

Example 1, which is one example of a preferred embodiment of the present invention, is shown in part (b) of FIG. 9. In part (b) of FIG. 9, an example is shown in which the standard deviation SD of the pitch deviation ratio is set at about 0.2%. In Example 1, the occurrence of ripples can be reduced or prevented on a high-frequency side with respect to the anti-resonant frequency of the surface acoustic wave resonator 1 more than Comparative Example 3.

Example 2, which is one example of a preferred embodiment of the present invention, is shown in part (c) of FIG. 9. In part (c) of FIG. 9, an example is shown in which the standard deviation SD of the pitch deviation ratio is set at about 0.7%. In Example 2, the occurrence of ripples can be reduced or prevented on a high-frequency side with respect to the anti-resonant frequency of the surface acoustic wave resonator 1 more than Comparative Example 3 and Example 1.

Example 3, which is one example of a preferred embodiment of the present invention, is shown in part (d) of FIG. 9. In part (d) of FIG. 9, an example is shown in which the standard deviation SD of the pitch deviation ratio is set at about 0.9%. In Example 3, the occurrence of ripples can be reduced or prevented on a high-frequency side with respect to the anti-resonant frequency of the surface acoustic wave resonator 1.

Figure 10:
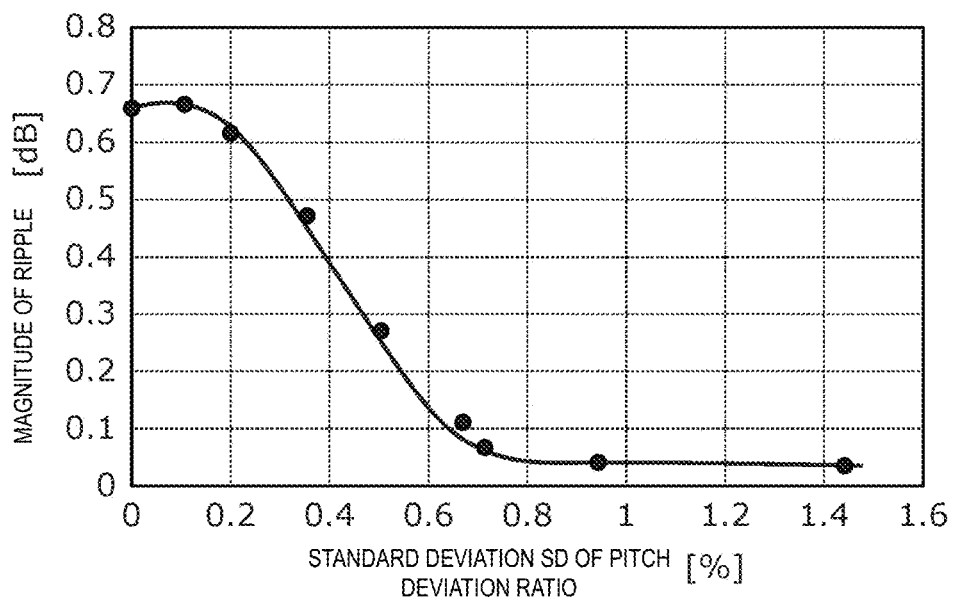
FIG. 10 is a diagram showing a relationship between the standard deviation of the pitch deviation ratio of the electrode finger and the magnitude of ripple.

FIG. 10 is a diagram showing a relationship between the standard deviation SD of the pitch deviation ratio of the electrode finger Fe and the magnitude of ripple. FIG. 10 shows the magnitude of each ripple when the standard deviation SD of the pitch deviation ratio of the electrode fingers Fe is changed from about 0.0% to about 1.45%. The magnitude of ripple means a difference between an upper-limit value and a lower-limit value of the ripple when the insertion loss is plotted on the vertical axis (refer to FIG. 9A and so forth).

As shown in FIG. 10, when the standard deviation SD of the pitch deviation ratio of the electrode fingers Fe is, for example, about 0.2% or larger, ripples are small compared with a case in which the standard deviation SD is about 0.1%. Thus, by setting the standard deviation SD of the pitch deviation ratio at about 0.2% or larger, the occurrence of large ripples can be reduced or prevented on a high-frequency side with respect to the anti-resonant frequency of the surface acoustic wave resonator 1.

Also, when the standard deviation SD of the pitch deviation ratio of the electrode fingers Fe is, for example, about 0.7% or larger, ripples are smaller compared with a case in which the standard deviation SD is about 0.2%. Thus, by setting the standard deviation SD of the pitch deviation ratio at about 0.7% or larger, the occurrence of ripples can be further reduced or prevented on a high-frequency side with respect to the anti-resonant frequency of the surface acoustic wave resonator 1.

Also, when the standard deviation SD of the pitch deviation ratio of the electrode fingers Fe is, for example, about 0.95% or larger, ripples are even small, and the value of the magnitude of ripple hardly varies. This tendency does not change even when the standard deviation SD of the pitch deviation ratio is, for example, about 1.4%, and can be considered not to change even when the standard deviation SD is about 3% or about 10%, for example. Thus, by setting the standard deviation SD of the pitch deviation ratio at, for example, about 0.95% or larger, the occurrence of ripples can be further reduced or prevented on a high-frequency side with respect to the anti-resonant frequency of the surface acoustic wave resonator 1.

Structure of Multiplexer

Figure 11:
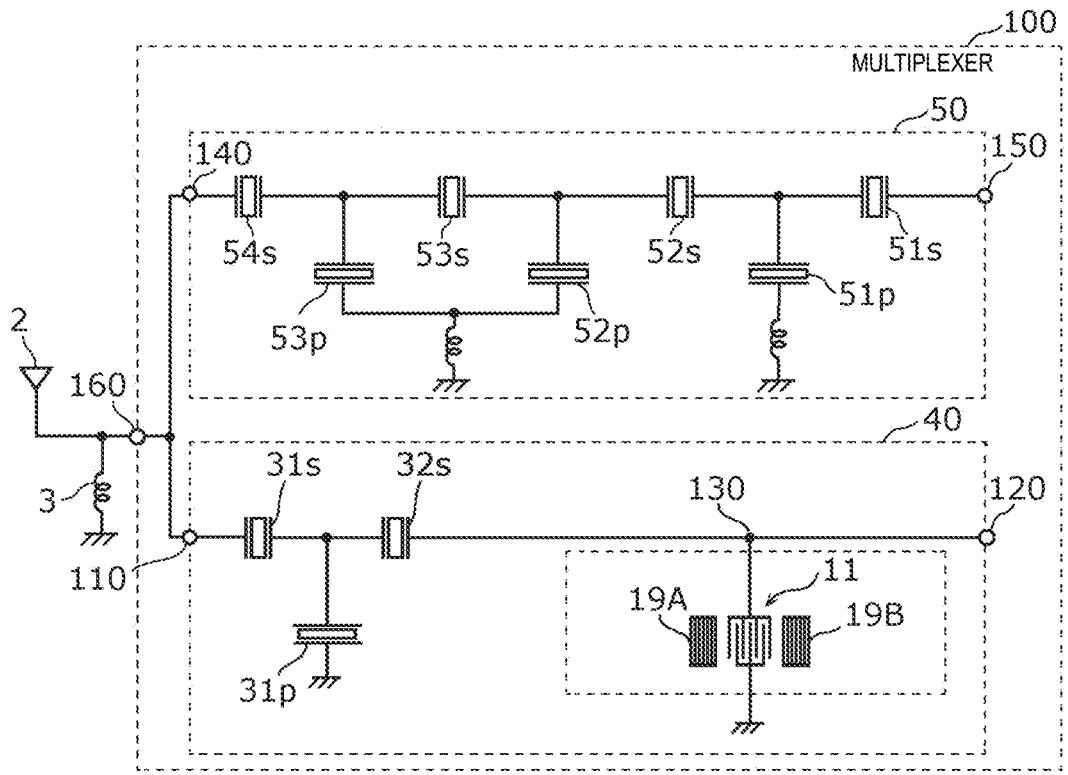
FIG. 11 is a diagram of the structure of a multiplexer and its peripheral circuit according to a preferred embodiment of the present invention.

FIG. 11 is a diagram of the structure of a multiplexer 100 and its peripheral circuit according to a preferred embodiment of the present invention. As shown in FIG. 11, the multiplexer 100 includes the acoustic wave filter 40, a filter 50, and a common terminal 160. The multiplexer 100 is connected to an antenna 2 at the common terminal 160. Between the ground and a connection path between the common terminal 160 and the antenna 2, an inductor 3 providing impedance matching is connected. Note that the inductor 3 may be connected in series between the common terminal 160 and the antenna 2. The inductor 3 may be included in the multiplexer 100 or may be externally provided to the multiplexer 100. Also, the inductor 3 may be, for example, a capacitor or a combined circuit including an inductor and a capacitor.

To the common terminal 160, the input/output terminal 110 of the acoustic wave filter 40 and an input/output terminal 140 of the filter 50 are connected.

The acoustic wave filter 40 uses, for example, a Love wave as an acoustic wave. The IDT electrode 11 and the reflectors 19A and 19B, which the surface acoustic wave resonator 1 of the acoustic wave filter 40 includes, has a distribution of the electrode finger pitch P(k) shown in FIG. 6.

The filter 50 is a ladder acoustic wave filter including the input/output terminal 140 and an input/output terminal 150 and includes a plurality of acoustic wave resonators. The filter 50 includes series-arm resonators 51s, 52s, 53s, and 54s and parallel-arm resonators 51p, 52p, and 53p. The series-arm resonators 51s, 52s, 53s, and 54s are arranged in series on a path connecting the input/output terminal 140 and the input/output terminal 150. The parallel-arm resonators 51p, 52p, and 53p are each connected between a node on the path and the ground.

For example, the acoustic wave filter 40 is applied to a transmission filter, and the filter 50 is applied to a reception filter. The pass band of the acoustic wave filter 40 is positioned on a low-frequency side with respect to the pass band of the filter 50.

For example, the acoustic wave filter 40 is applied to a transmission filter in Long Term Evolution (LTE), and the filter 50 is applied to a reception filter in LTE.

Summarization

As described above, the surface acoustic wave resonator 1 according to the present preferred embodiment includes the substrate 60 having piezoelectricity, the IDT electrode 11 provided on the substrate 60, and the reflectors 19A and 19B sandwiching the IDT electrode 11 in the propagation direction of the acoustic wave. The IDT electrode 11 included in the surface acoustic wave resonator 1 includes one IDT electrode. The IDT electrode 11 and the reflectors 19A and 19B each include the plurality of electrode fingers Fe extending in a direction crossing the propagation direction of the acoustic wave and arranged in parallel or substantially in parallel to one another.

When (1) a distance between a k-th electrode finger, where k is an integer larger than or equal to 2, and a (k+1)-th electrode finger in the propagation direction of the acoustic wave is defined as a k-th electrode finger pitch, (2) in a (k−1)-th electrode finger, the k-th electrode finger, and the (k+1) electrode finger adjacent to each other, a value obtained by dividing a difference between the k-th electrode finger pitch and a section average electrode finger pitch, which is an average of the (k−1)-th electrode finger pitch and the (k+1)-th electrode finger pitch, by an overall average electrode finger pitch, which is an average pitch of overall electrode fingers which the IDT electrode 11 or the reflectors 19A and 19B include, the IDT electrode 11 or the reflectors 19A and 19B including the adjacent three electrode fingers, is defined as the pitch deviation ratio D(k) of the k-th electrode finger, and (3) a distribution of the pitch deviation ratio D(k) obtained by calculating the pitch deviation ratio D(k) of the k-th electrode finger for all of the electrode fingers which the IDT electrode 11 or the reflectors 19A and 19B include, the IDT electrode 11 or the reflectors 19A and 19B including the adjacent three electrode fingers, is defined as a histogram of the pitch deviation ratio D(k), at least one of the IDT electrode 11 and the reflectors 19A and 19B includes the standard deviation SD of the pitch deviation ratio D(k) in the above-described histogram larger than or equal to about 0.2%.

Thus, since the standard deviation SD of the pitch deviation ratio D(k) of the electrode finger Fe(k) is about 0.2% or larger, an abrupt decrease in the reflection coefficient can be reduced or prevented with respect to a frequency higher than the anti-resonant frequency. With this, an occurrence of an unwanted standing wave in the surface acoustic wave resonator 1 can be reduced or prevented, and an occurrence of large ripples on a high-frequency side with respect to the anti-resonant frequency can be reduced or prevented.

Also, the surface acoustic wave resonator 1 may have a relationship in which, when electrode finger pitches of four electrode fingers adjacent to one another in the propagation direction of the acoustic wave are taken as P(k−1), P(k), and P(k+1) in order of alignment in the propagation direction of the acoustic wave, $P(k-1)<P(k+1)<P(k)$ or $P(k-1)>P(k+1)>P(k)$ is at least partially satisfied.

Since the surface acoustic wave resonator 1 has the above-described relationship of the electrode finger pitches, an abrupt decrease in the reflection coefficient can be reduced or prevented with respect to a frequency higher than the anti-resonant frequency. With this, an occurrence of an unwanted standing wave in the surface acoustic wave resonator 1 can be reduced or prevented, and an occurrence of large ripples on a high-frequency side with respect to the anti-resonant frequency can be reduced or prevented.

Also, a portion of the electrode fingers of the plurality of electrode fingers may have a constant or substantially constant electrode finger pitch, and electrode fingers that remain except the portion may have a relationship of $P(k-1)<P(k+1)<P(k)$ or $P(k-1)>P(k+1)>P(k)$.

Thus, since electrode fingers that remain except the portion have the above-described relationship of the electrode finger pitches, an abrupt decrease in the reflection coefficient can be reduced or prevented with respect to a frequency higher than the anti-resonant frequency. With this, an occurrence of an unwanted standing wave in the surface acoustic wave resonator 1 can be reduced or prevented, and an occurrence of large ripples on a high-frequency side with respect to the anti-resonant frequency can be reduced or prevented.

Also, the plurality of electrode fingers included in the IDT electrode 11 may have a constant or substantially constant electrode finger pitch, and the plurality of electrode fingers included in the reflectors (for example, the reflector 19A) may have a relationship of $P(k-1)<P(k+1)<P(k)$ or $P(k-1)>P(k+1)>P(k)$.

Thus, since the plurality of electrode fingers included in the reflectors have the above-described relationship of the electrode finger pitches, an abrupt decrease in the reflection coefficient can be reduced or prevented with respect to a frequency higher than the anti-resonant frequency. With this, an occurrence of an unwanted standing wave in the surface acoustic wave resonator 1 can be reduced or prevented, and an occurrence of large ripples on a high-frequency side with respect to the anti-resonant frequency can be reduced or prevented.

Also, the plurality of electrode fingers included in the reflectors 19A and 19B may have a constant or substantially constant electrode finger pitch, and the plurality of electrode fingers included in the IDT electrode 11 may have a relationship of $P(k-1)<P(k+1)<P(k)$ or $P(k-1)>P(k+1)>P(k)$.

Thus, since the plurality of electrode fingers included in the IDT electrode 11 have the above-described relationship of the electrode finger pitches, an abrupt decrease in the reflection coefficient can be reduced or prevented with respect to a frequency higher than the anti-resonant frequency. With this, an occurrence of an unwanted standing wave in the surface acoustic wave resonator 1 can be reduced or prevented, and an occurrence of large ripples on a high-frequency side with respect to the anti-resonant frequency can be reduced or prevented.

The surface acoustic wave resonator 1 according to the present preferred embodiment includes the substrate 60 having piezoelectricity, and the IDT electrode 11 provided on the substrate 60. The IDT electrode 11 included in the surface acoustic wave resonator 1 includes one IDT electrode. The IDT electrode 11 includes a plurality of electrode fingers extending in a direction crossing a propagation direction of an acoustic wave and arranged in parallel or substantially in parallel to one another.

When (1) a distance between a k-th electrode finger, k is an integer larger than or equal to 2m and a (k+1)-th electrode finger in the propagation direction of the acoustic wave is defined as a k-th electrode finger pitch, (2) in a (k−1)-th electrode finger, the k-th electrode finger, and the (k+1)-th electrode finger adjacent to each other, a value obtained by dividing a difference between the k-th electrode finger pitch and a section average electrode finger pitch, which is an average of the (k−1)-th electrode finger pitch and the (k+1)-th electrode finger pitch, by an overall average electrode finger pitch, which is an average pitch of overall electrode fingers which the IDT electrode 11 including the adjacent three electrode fingers has, is defined as a pitch deviation ratio D(k) of the k-th electrode finger, and (3) a distribution of the pitch deviation ratio D(k) obtained by calculating the pitch deviation ratio D(k) of the k-th electrode finger for all electrode fingers which the IDT electrode 11 including the adjacent three electrode fingers has is defined as a histogram of the pitch deviation ratio D(k), the IDT electrode 11 has a standard deviation SD of the pitch deviation ratio D(k) in the histogram larger than or equal to about 0.2%.

Thus, since the standard deviation SD of the pitch deviation ratio D(k) of the electrode finger Fe(k) is 0.2% or larger, an abrupt decrease in the reflection coefficient can be suppressed with respect to a frequency higher than the anti-resonant frequency. With this, occurrence of an unwanted standing wave in the surface acoustic wave resonator 1 can be suppressed, and occurrence of large ripples on a high-frequency side with respect to the anti-resonant frequency can be suppressed.

Also, the surface acoustic wave resonator 1 may have a relationship in which, when electrode finger pitches of four electrode fingers adjacent to one another in the propagation direction of the acoustic wave are denoted as P(k−1), P(k), and P(k+1) in order of alignment in the propagation direction of the acoustic wave, P(k−1)<P(k+1)<P(k) or P(k−1)>P(k+1)>P(k) is at least partially satisfied.

Since the surface acoustic wave resonator 1 has the above-described relationship of the electrode finger pitches, an abrupt decrease in the reflection coefficient can be reduced or prevented with respect to a frequency higher than the anti-resonant frequency. With this, an occurrence of an unwanted standing wave in the surface acoustic wave resonator 1 can be reduced or prevented, and an occurrence of large ripples on a high-frequency side with respect to the anti-resonant frequency can be reduced or prevented.

Also, a portion of the electrode fingers of the plurality of electrode fingers may have a constant or substantially constant electrode finger pitch, and electrode fingers that remain except the portion may have a relationship of P(k−1)<P(k+1)<P(k) or P(k−1)>P(k+1)>P(k).

Thus, since electrode fingers that remain except the portion have the above-described relationship of the electrode finger pitches, an abrupt decrease in the reflection coefficient can be reduced or prevented with respect to a frequency higher than the anti-resonant frequency. With this, an occurrence of an unwanted standing wave in the surface acoustic wave resonator 1 can be reduced or prevented, and an occurrence of large ripples on a high-frequency side with respect to the anti-resonant frequency can be reduced or prevented.

Also, all of the electrode finger pitches between two electrode fingers adjacent to each other in the propagation direction of the acoustic wave may be varied with one another.

Thus, since all of the electrode finger pitches are varied, an abrupt decrease in the reflection coefficient can be reduced or prevented with respect to a frequency higher than the anti-resonant frequency. With this, an occurrence of an unwanted standing wave in the surface acoustic wave resonator 1 can be reduced or prevented, and an occurrence of large ripples on a high-frequency side with respect to the anti-resonant frequency can be reduced or prevented.

The acoustic wave filter 40 according to the present preferred embodiment is an acoustic wave filter including the above-described surface acoustic wave resonator 1.

According to this, it is possible to provide the acoustic wave filter 40 including the surface acoustic wave resonator 1 capable of reducing or preventing an occurrence of large ripples on a high-frequency side with respect to the anti-resonant frequency.

Also, the acoustic wave filter 40 may include a ladder circuit including series-arm resonators and parallel-arm resonators, and at least one of the parallel-arm resonators may be defined by the surface acoustic wave resonator 1.

According to this, an occurrence of large ripples can be reduced or prevented on a high-frequency side with respect to the anti-resonant frequency of the parallel-arm resonator. With this, an increase in insertion loss can be reduced or prevented on the pass band of the acoustic wave filter 40.

The multiplexer 100 according to the present preferred embodiment includes a transmission filter and a reception filter. The transmission filter includes the above-described acoustic wave filter 40.

According to this, an occurrence of ripples can be reduced or prevented outside the pass band of the transmission filter. With this, an increase in insertion loss can be reduced or prevented in the pass band of the reception filter outside the pass band of the transmission filter.

Here, a point is described in which the pitch deviation ratios of the surface acoustic wave resonators disclosed in Japanese Unexamined Patent Application Publication No. 2018-182460, Japanese Unexamined Patent Application Publication No. 2013-85273 and International Publication No. 2017/131170 described above is significantly different from the pitch deviation ratio of the surface acoustic wave resonator 1 of the present preferred embodiment.

The pitch deviation ratios in Japanese Unexamined Patent Application Publication No. 2018-182460, Japanese Unexamined Patent Application Publication No. 2013-85273 and International Publication No. 2017/131170 are calculated from the definition (1), (2), and (3) in the present specification by using each pitch disclosed in Japanese Unexamined Patent Application Publication No. 2018-182460, Japanese Unexamined Patent Application Publication No. 2013-85273 and International Publication No. 2017/131170. The pitch deviation ratio in Comparative Example 2A of Japanese Unexamined Patent Application Publication No. 2018-182460 is 0.008%. The pitch deviation ratio in Comparative Example 2B of Japanese Unexamined Patent Application Publication No. 2018-182460 is 0.016%. The pitch deviation ratio in Comparative Example 2C of Japanese Unexamined Patent Application Publication No. 2018-182460 is 0.025%. The pitch deviation ratio in Comparative Example 3A of Japanese Unexamined Patent Application Publication No. 2018-182460 is 0.027%. The pitch deviation ratio in Comparative Example 3B of Japanese Unexamined Patent Application Publication No. 2018-182460 is 0.048%. The pitch deviation ratio in Comparative Example 3C of Japanese Unexamined Patent Application Publication No. 2018-182460 is 0.068%. The pitch deviation ratio in Japanese Unexamined Patent Application Publication No. 2013-85273 is 0.045%. The pitch deviation ratio in International Publication No. 2017/131170 is 0.183%.

Thus, the pitch deviation ratios of the surface acoustic wave resonators in Japanese Unexamined Patent Application Publication No. 2018-182460, Japanese Unexamined Patent Application Publication No. 2013-85273 and International Publication No. 2017/131170 are considerably smaller, compared with the maximum value and the minimum value of the pitch deviation ratio of the surface acoustic wave resonator 1 of the present preferred embodiment (refer to FIG. 8B). In the surface acoustic wave resonator 1 of the present preferred embodiment, since the values of the pitch deviation ratio D(k) of the electrode finger Fe(k) are widely distributed, an abrupt decrease in the reflection coefficient can be reduced or prevented with respect to a frequency higher than the anti-resonant frequency. With this, an occurrence of an unwanted standing wave in the surface acoustic wave resonator 1 can be reduced or prevented, and an occurrence of large ripples on a high-frequency side with respect to the anti-resonant frequency can be reduced or prevented.

Modifications

While the surface acoustic wave resonators, the acoustic wave filters, and the multiplexers according to preferred embodiments of the present invention have been described above by describing the preferred embodiments, the surface acoustic wave resonators, the acoustic wave filters, and the multiplexers of the present invention are not limited to the above-described preferred embodiment. Another preferred embodiment provided by combining any component in the above-described preferred embodiment, a modification obtained by variously modifying the above-described preferred embodiment as conceived by a person skilled in the art in a range not deviating the gist of the present invention, and various devices including therein the surface acoustic wave resonator, the acoustic wave filter, and the multiplexer in the above-described preferred embodiment are also included in the present invention.

For example, in the surface acoustic wave resonator 1, it is only necessary that the standard deviation SD of the pitch deviation ratio of at least one of the IDT electrode 11 and the reflectors 19A and 19B is about 0.2% or larger. Also, for example, in the surface acoustic wave resonator 1, the standard deviation SD of the pitch deviation ratio of the IDT electrode 11 may be about 0.2% or larger and the standard deviation SD of the pitch deviation ratio of each of the reflectors 19A and 19B may be smaller than about 0.2%. Furthermore, for example, in the surface acoustic wave resonator 1, the standard deviation SD of the pitch deviation ratio of at least one of the reflectors 19A and 19B may be about 0.2% or larger and the standard deviation SD of the pitch deviation ratio of the IDT electrode 11 may be smaller than about 0.2%.

The above-described multiplexer can be applied not only to a duplexer but also, for example, to a triplexer in which three filters are commonly connected to an antenna, a hexaplexer in which three duplexers are commonly connected with a common terminal, and so forth. That is, the above-described multiplexer is only required to include two or more filters.

Also, the multiplexer according to a preferred embodiment of the present invention is not limited to a structure including both of a transmission filter and a reception filter, but may have a structure including only a plurality of transmission filters or only a plurality of reception filters.

Also, in the acoustic wave filter and the multiplexer in the above-described preferred embodiment, in a path connecting each circuit element (and component) disclosed in the drawings and a signal path, another circuit element, wire, and so forth may be inserted.

Preferred embodiments of the present invention can be widely used for transmission/reception filters and multiplexers for use at a front end of a wireless communication terminal in which high attenuation outside the pass band is required.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave resonator comprising:
   a substrate having piezoelectricity;
   an IDT electrode on the substrate; and
   reflectors sandwiching the IDT electrode in a propagation direction of an acoustic wave; wherein
   the IDT electrode is defined by only one IDT electrode;
   the IDT electrode and the reflectors each include a plurality of electrode fingers extending in a direction crossing the propagation direction of the acoustic wave and being in parallel or substantially in parallel to one another; and
   when
   a distance between a k-th electrode finger and a (k+1)-th electrode finger in the propagation direction of the acoustic wave is defined as a k-th electrode finger pitch, where k is an integer larger than or equal to 2;
   in a (k−1)-th electrode finger, the k-th electrode finger, and the (k+1)-th electrode finger adjacent to each other, a value obtained by dividing a difference between the k-th electrode finger pitch and a section average electrode finger pitch, which is an average of the (k−1)-th electrode finger pitch and the (k+1)-th electrode finger pitch, by an overall average electrode finger pitch, which is an average pitch of overall electrode fingers which the IDT electrode or the reflectors have, the IDT electrode or the reflectors including the adjacent three electrode fingers, is defined as a pitch deviation ratio of the k-th electrode finger; and
   a distribution of the pitch deviation ratio obtained by calculating the pitch deviation ratio of the k-th electrode finger for all of the electrode fingers which the IDT electrode or the reflectors include, the IDT electrode or the reflectors including the adjacent three electrode fingers, is defined as a histogram of the pitch deviation ratio;
   at least one of the IDT electrode and the reflectors has a standard deviation of the pitch deviation ratio in the histogram larger than or equal to about 0.2%.

2. The surface acoustic wave resonator according to claim 1, wherein the surface acoustic wave resonator has a relationship in which, when the electrode finger pitches of four of the plurality of electrode fingers adjacent to one another in the propagation direction of the acoustic wave are denoted as P(k−1), P(k), and P(k+1) in order of alignment in the propagation direction of the acoustic wave, P(k−1)<P(k+1)<P(k) or P(k−1)>P(k+1)>P(k) is at least partially satisfied.

3. The surface acoustic wave resonator according to claim 2, wherein
   a portion of the electrode fingers of the plurality of electrode fingers has a constant or substantially constant electrode finger pitch; and electrode fingers that remain except the portion have a relationship of $P(k-1)<P(k+1)<P(k)$ or $P(k-1)>P(k+1)>P(k)$.

4. The surface acoustic wave resonator according to claim 3, wherein
the plurality of electrode fingers included in the IDT electrode have a constant or substantially constant electrode finger pitch; and
the plurality of electrode fingers included in the reflectors have a relationship of $P(k-1)<P(k+1)<P(k)$ or $P(k-1)>P(k+1)>P(k)$.

5. The surface acoustic wave resonator according to claim 3, wherein
the plurality of electrode fingers included in the reflectors have a constant or substantially constant electrode finger pitch; and
the plurality of electrode fingers included in the IDT electrode have a relationship of $P(k-1)<P(k+1)<P(k)$ or $P(k-1)>P(k+1)>P(k)$.

6. A surface acoustic wave resonator comprising:
a substrate having piezoelectricity; and
an IDT electrode on the substrate; wherein
the IDT electrode is defined by only one IDT electrode;
the IDT electrode includes a plurality of electrode fingers extending in a direction crossing a propagation direction of an acoustic wave and being in parallel or substantially in parallel to one another; and
when
a distance between a k-th electrode finger and a (k+1)-th electrode finger in the propagation direction of the acoustic wave is defined as a k-th electrode finger pitch, where k is an integer larger than or equal to 2;
in a (k-1)-th electrode finger, the k-th electrode finger, and the (k+1)-th electrode finger adjacent to each other, a value obtained by dividing a difference between the k-th electrode finger pitch and a section average electrode finger pitch, which is an average of the (k-1)-th electrode finger pitch and the (k+1)-th electrode finger pitch, by an overall average electrode finger pitch, which is an average pitch of overall electrode fingers which the IDT electrode including the adjacent three electrode fingers has, is defined as a pitch deviation ratio of the k-th electrode finger; and
a distribution of the pitch deviation ratio obtained by calculating the pitch deviation ratio of the k-th electrode finger for all of the electrode fingers which the IDT electrode including the adjacent three electrode fingers includes is defined as a histogram of the pitch deviation ratio;
the IDT electrode has a standard deviation of the pitch deviation ratio in the histogram larger than or equal to about 0.2%.

7. The surface acoustic wave resonator according to claim 6, wherein
the surface acoustic wave resonator has a relationship in which, when the electrode finger pitches of four electrode fingers adjacent to one another in the propagation direction of the acoustic wave are denoted as $P(k-1)$, $P(k)$, and $P(k+1)$ in order of alignment in the propagation direction of the acoustic wave, $P(k-1)<P(k+1)<P(k)$ or $P(k-1)>P(k+1)>P(k)$ is at least partially satisfied.

8. The surface acoustic wave resonator according to claim 7, wherein
a portion of the electrode fingers of the plurality of electrode fingers has an electrode finger pitch that is constant or substantially constant; and
electrode fingers that remain except the portion have a relationship of $P(k-1)<P(k+1)<P(k)$ or $P(k-1)>P(k+1)>P(k)$.

9. The surface acoustic wave resonator according to claim 1, wherein all of the electrode finger pitches between two electrode fingers adjacent to each other in the propagation direction of the acoustic wave are varied with one another.

10. An acoustic wave filter comprising:
the surface acoustic wave resonator according to claim 1.

11. The acoustic wave filter according to claim 10, wherein
the acoustic wave filter includes a ladder circuit including series-arm resonators and parallel-arm resonators; and
at least one of the parallel-arm resonators is defined by the surface acoustic wave resonator.

12. The acoustic wave filter according to claim 10, wherein the surface acoustic wave resonator has a relationship in which, when the electrode finger pitches of four of the plurality of electrode fingers adjacent to one another in the propagation direction of the acoustic wave are denoted as $P(k-1)$, $P(k)$, and $P(k+1)$ in order of alignment in the propagation direction of the acoustic wave, $P(k-1)<P(k+1)<P(k)$ or $P(k-1)>P(k+1)>P(k)$ is at least partially satisfied.

13. The acoustic wave filter according to claim 12, wherein
a portion of the electrode fingers of the plurality of electrode fingers has a constant or substantially constant electrode finger pitch; and
electrode fingers that remain except the portion have a relationship of $P(k-1)<P(k+1)<P(k)$ or $P(k-1)>P(k+1)>P(k)$.

14. The acoustic wave filter according to claim 13, wherein
the plurality of electrode fingers included in the IDT electrode have a constant or substantially constant electrode finger pitch; and
the plurality of electrode fingers included in the reflectors have a relationship of $P(k-1)<P(k+1)<P(k)$ or $P(k-1)>P(k+1)>P(k)$.

15. The acoustic wave filter according to claim 13, wherein
the plurality of electrode fingers included in the reflectors have a constant or substantially constant electrode finger pitch; and
the plurality of electrode fingers included in the IDT electrode have a relationship of $P(k-1)<P(k+1)<P(k)$ or $P(k-1)>P(k+1)>P(k)$.

16. A multiplexer comprising:
a transmission filter; and
a reception filter; wherein
the transmission filter includes the acoustic wave filter according to claim 10.

17. An acoustic wave filter comprising:
the surface acoustic wave resonator according to claim 6.

18. The acoustic wave filter according to claim 17, wherein
the acoustic wave filter includes a ladder circuit including series-arm resonators and parallel-arm resonators; and
at least one of the parallel-arm resonators is defined by the surface acoustic wave resonator.

19. The acoustic wave filter according to claim 17, wherein
the surface acoustic wave resonator has a relationship in which, when the electrode finger pitches of four electrode fingers adjacent to one another in the propagation direction of the acoustic wave are denoted as $P(k-1)$, $P(k)$, and $P(k+1)$ in order of alignment in the propagation direction of the acoustic wave, $P(k-1)<P(k+1)<P(k)$ or $P(k-1)>P(k+1)>P(k)$ is at least partially satisfied.

20. A multiplexer comprising:
a transmission filter; and
a reception filter; wherein
the transmission filter includes the acoustic wave filter according to claim 17.

* * * * *